United States Patent
Yuan et al.

(10) Patent No.: US 9,646,742 B2
(45) Date of Patent: May 9, 2017

(54) ELECTRICITY TRANSMISSION COOLING SYSTEM

(71) Applicant: American Superconductor Corporation, Devens, MA (US)

(72) Inventors: Jie Yuan, South Grafton, MA (US); James F. Maguire, Andover, MA (US)

(73) Assignee: American Superconductor Corporation, Devens, MA (US)

(*) Notice: Subject to any disclaimer, the term of this patent is extended or adjusted under 35 U.S.C. 154(b) by 151 days.

(21) Appl. No.: 14/688,394

(22) Filed: Apr. 16, 2015

(65) Prior Publication Data
US 2015/0364232 A1  Dec. 17, 2015

Related U.S. Application Data

(62) Division of application No. 13/607,130, filed on Sep. 7, 2012, now Pat. No. 9,037,202, which is a division
(Continued)

(51) Int. Cl.
*H01B 12/00* (2006.01)
*H01L 39/00* (2006.01)
(Continued)

(52) U.S. Cl.
CPC .............. *H01B 12/16* (2013.01); *H01L 39/00* (2013.01); *H01L 39/02* (2013.01); *H02G 15/34* (2013.01); *Y02E 40/647* (2013.01); *Y02E 40/648* (2013.01)

(58) Field of Classification Search
CPC ......... H01B 12/00; H01B 12/92; H01L 39/00; H01L 39/06; H01L 39/08; H02G 15/00; H02G 15/02; H02G 15/08
See application file for complete search history.

(56) References Cited

U.S. PATENT DOCUMENTS 3,900,699 A  8/1975  Penczynksi et al.
7,279,639 B2  10/2007  Ashibe et al.
(Continued)

FOREIGN PATENT DOCUMENTS

CN  1731536  2/2006
EP  1667172  7/2006
(Continued)

OTHER PUBLICATIONS

Office Action from corresponding Chinese Patent Application No. 200910204982.5 dated Jun. 20, 2012 (6 pgs.) (no English translation provided).
(Continued)

*Primary Examiner* — Mark Kopec
(74) *Attorney, Agent, or Firm* — John W. Powell

(57) ABSTRACT

A method for cooling high temperature superconducting (HTS) cable comprising receiving a first flow of coolant at a first section of HTS cable and permitting the first flow of coolant to flow therethrough. The method also includes receiving a second flow of coolant at a second section of HTS cable and permitting the second flow of coolant to flow therethrough. The first section of HTS cable and said second section of HTS cable are coupled via a cable joint, the cable joint electrically connecting the first and second sections of HTS cable. The cable joint is in fluid communication with at least one refrigeration module. The cable joint includes at least one conduit configured to permit a third flow of coolant between the cable joint and the at least one refrigeration module through a coolant line separate from the first and second sections of HTS cable.

4 Claims, 8 Drawing Sheets

Related U.S. Application Data of application No. 12/245,138, filed on Oct. 3, 2008, now Pat. No. 8,280,467.

(51) Int. Cl.
- *H01B 12/16* (2006.01)
- *H02G 15/34* (2006.01)
- *H01L 39/02* (2006.01)

(56) References Cited

U.S. PATENT DOCUMENTS

| | | | |
|---|---|---|---|
| 7,304,826 B2 | 12/2007 | Yuan et al. | |
| 7,453,041 B2 | 11/2008 | Maguire et al. | |
| 7,614,243 B2 | 11/2009 | Masuda et al. | |
| 8,280,467 B2 * | 10/2012 | Yuan | H01B 12/16 174/125.1 |
| 9,037,202 B2 * | 5/2015 | Yuan | H01B 12/16 505/163 |
| 2006/0150639 A1 | 7/2006 | Zia et al. | |
| 2006/0283620 A1 | 12/2006 | Maguire et al. | |
| 2007/0084623 A1 | 4/2007 | Yamaguchi | |
| 2007/0107443 A1 | 5/2007 | Royal et al. | |
| 2008/0110659 A1 | 5/2008 | Ashibe | |
| 2008/0202127 A1 | 8/2008 | Mukoyama et al. | |
| 2009/0241558 A1 | 10/2009 | Yuan et al. | |

FOREIGN PATENT DOCUMENTS

| | | |
|---|---|---|
| JP | 11121059 | 4/1999 |
| WO | WO01/08171 A1 | 2/2001 |

OTHER PUBLICATIONS

English Translation of Abstract of Chinese publication No. 1731536 (1 pg.) (doc pub Feb. 2006).

Lee et al., "Cryogenic Refrigeration System for HTS Cables," IEEE Transactions on Applied Superconductivity, Jun. 2005, pp. 1798-1801. V.15, No. 2.

Maguire, J.F., et al., "Development and Demonstration of a Long Length HTS Cable to Operate in the Long Island Power Authority Transmission Grid," IEEE Transactions on Applied Superconductivity, Jun. 2005, pp. 1787-1792, V.15, No. 2.

Kraemer, H.P., et al., "Switching Behavior of YBCO Thin Film Conductors in Resistive Fault Current Limiters," IEEE Transactions on Applied Superconductivity, Jun. 2003, pp. 2044-2047, V.13, No. 2.

International Preliminary Report on Patentability with Written Opinion, mailed Apr. 14, 2011, received in international patent application No. PCT/US2009/057957, 12 pgs.

International Search Report with Written Opinion, dated Dec. 22, 2009, received in international patent application No. PCT/US2009/057957, 17 pgs.

* cited by examiner

ELECTRICITY TRANSMISSION COOLING SYSTEM

CROSS-REFERENCE TO RELATED APPLICATION

This application is a divisional of U.S. patent application Ser. No. 13/607,130, filed Sep. 7, 2012, now U.S. Pat. No. 9,037,202, which claims priority to U.S. patent application Ser. No. 12/245,138 filed Oct. 3, 2008, now U.S. Pat. No. 8,280,467, the entire disclosure of which is incorporated herein by reference in its entirety.

GOVERNMENT RIGHTS

This invention was made with Government support under Agreement No.: DE-FC26-07NT43240. The Government has certain rights in the invention.

TECHNICAL FIELD

This disclosure relates to cooling systems and, more particularly, to cryogenic cooling systems for high temperature superconductor ("HTS") devices, in particular HTS power cables.

BACKGROUND

Superconductivity refers to a state of materials in which the electrical resistance becomes zero when the material is cooled to a sufficiently low temperature, referred to as the critical temperature. One type of superconductor, referred to as a high temperature superconductor (HTS), has a critical temperature in excess of the boiling point of liquid nitrogen of 77° K at atmospheric pressure.

The use of superconductive materials and, in particular, superconducting cables, is advantageous because of the elimination of resistive losses. As a result, superconducting cables are being designed, built and tested for use in industrial applications, such as power transmission systems.

High temperature superconductors may be used to construct superconducting power cables, which are capable of serving very large power requirements at medium voltage ratings. To make a HTS cable operate properly, cryogenic cooling systems with circulating sub-cooled liquid nitrogen are often used to maintain the HTS cable in a superconducting state during normal operation.

Conventionally, cryogenic refrigeration systems are used to cool cold dielectric superconducting cables to a temperature (~70K), which may be much lower than the HTS critical temperature (90K). This may allow the transmission of a higher critical current since the critical current increases dramatically with a decrease in the operating temperature. Such systems may contain a refrigeration unit, a circulating pump and a cooling loop for providing a refrigerant, or coolant, such as liquid nitrogen, at a temperature much lower than the critical temperature. The refrigeration unit is a mechanical refrigeration device that produces cooling power at cryogenic temperature. The coolant, e.g. liquid nitrogen, flows from the refrigeration unit into the cooling loop via a circulating pump. The coolant circulates through the cooling loop extracting heat from the HTS cable, and then returns to the refrigeration system for removal of the heat and circulates back to the cooling loop. The cooling loop could be a tube external to the superconducting cable assembly or the hollow center formed by the superconducting cable former.

One cooling station and one cooling loop are often used for superconducting cable. Unfortunately, as a result of existing cooling system designs, the length of an HTS cable may be limited due to limited pressure head and cooling power produced by a single cooling station. These systems may also require that refrigeration systems be tailored to individual cable projects, which may result in an excessively high refrigeration system cost.

SUMMARY OF DISCLOSURE

In an embodiment of the present disclosure a cooling system includes a first section of high temperature superconducting (HTS) cable configured to receive a flow of coolant flowing at a first rate and to permit the flow of coolant to flow therethrough. The flow of coolant may undergo a temperature increase as it passes through the HTS cable. The cooling system may further include a first refrigeration module configured to receive the flow of coolant from the HTS cable and to lower the temperature of the flow of coolant. The first refrigeration module may be configured to divide the flow of coolant into a plurality of coolant streams, each coolant stream flowing at a second rate. The cooling system may also include a second section of HTS cable configured to receive at least one of the plurality of coolant streams. The second section of HTS cable may be configured to permit the at least one of the plurality of coolant streams to flow therethrough. The cooling system may additionally include a third section of HTS cable configured to receive the at least one of the plurality of coolant streams. The third section of HTS cable may be configured to permit the at least one of the plurality of coolant streams to flow therethrough. The plurality of coolant streams may be combined to form the flow of coolant flowing at the first rate.

One or more of the following features may be included. A second refrigeration module configured to receive the at least one of the plurality of coolant streams from the second section of HTS cable.

A third refrigeration module configured to receive at least one of the plurality of coolant streams from the third section of HTS cable. The plurality of coolant streams may be output from the second and third refrigeration modules and combined to form the flow of coolant.

At least one pressure control unit may be operatively connected with each section of HTS cable. The at least one pressure control unit may be configured to maintain a consistent operating pressure throughout each section of HTS cable.

In another embodiment of the present disclosure, a cable joint configured to couple a first section of high temperature superconducting (HTS) cable and a second section of HTS cable is provided. The cable joint may include an exterior layer and an interior layer operatively connected with the exterior layer. The interior and exterior layers may define a space therebetween. The cable joint may further include a conductive lead configured to electrically connect a portion of HTS wire associated with the first section of HTS cable with a portion of HTS wire associated with the second section of HTS cable. The cable joint may include at least one conduit configured to permit a flow of coolant between the cable joint and at least one refrigeration module through a coolant line separate from the first and second sections of HTS cable.

One or more of the following features may be included. The at least one conduit may include a first conduit configured to supply a first flow of coolant to said at least one refrigeration module and a second conduit configured to receive said first flow of coolant from said at least one refrigeration module following at least one of re-cooling and re-pressurization. The space between said interior and exterior layer may be pressurized. The interior layer and the conductive lead may define a passageway configured to permit a first flow of coolant therethrough. The conductive lead may include at least one opening configured to permit a second flow of coolant therethrough. The first and second coolant flows may be combined and delivered to at least one refrigeration module. In some embodiments the conductive lead may be constructed out of copper.

In another embodiment of the present disclosure a cooling system is provided. The cooling system may include a first section of high temperature superconducting (HTS) cable configured to receive a first flow of coolant and to permit the first flow of coolant to flow therethrough. The cooling system may also include a second section of high temperature superconducting (HTS) cable configured to receive a second flow of coolant and to permit the second flow of coolant to flow therethrough. The cooling system may also include a cable joint configured to couple the first section of HTS cable and the second section of HTS cable. The cable joint may be in fluid communication with at least one refrigeration module. The cable joint may include at least one conduit configured to permit a third flow of coolant between the cable joint and the at least one refrigeration module through a coolant line separate from the first and second sections of HTS cable.

One or more of the following features may be included. The cable joint may include a conductive lead configured to electrically connect a portion of HTS wire associated with the first section of HTS cable with a portion of HTS wire associated with the second section of HTS cable. The at least one refrigeration module may be configured to receive a combined flow of coolant from the cable joint and to perform at least one of re-cooling and re-pressurizing the combined flow of coolant.

In another embodiment of the present disclosure, a method for cooling high temperature superconducting (HTS) cable is provided. The method may include receiving a first flow of coolant at a first section of HTS cable and permitting the first flow of coolant to flow therethrough. The method may also include receiving a second flow of coolant at a second section of HTS cable and permitting the second flow of coolant to flow therethrough. The method may additionally include coupling the first section of HTS cable and the second section of HTS cable via a cable joint. The cable joint may be in fluid communication with at least one refrigeration module and may include at least one conduit configured to permit a third flow of coolant between the cable joint and the at least one refrigeration module through a coolant line separate from the first and second sections of HTS cable.

One or more of the following features may be included. Electrically connecting a portion of HTS wire associated with the first section of HTS cable with a portion of HTS wire associated with the second section of HTS cable via the cable joint. Receiving a combined flow of coolant from the cable joint at the at least one refrigeration module. The refrigeration module may be configured to perform at least one of re-cooling and re-pressurizing the combined flow of coolant.

Maintaining a constant pressure throughout each of the sections of HTS cable via at least one pressure control unit. The pressure control unit may be configured to receive and/or dispense a quantity of coolant in the event of a fault condition.

The details of one or more implementations are set forth in the accompanying drawings and the description below. Other features and advantages will become apparent from the description, the drawings, and the claims.

DETAILED DESCRIPTION OF THE PREFERRED EMBODIMENTS

Figure 1:
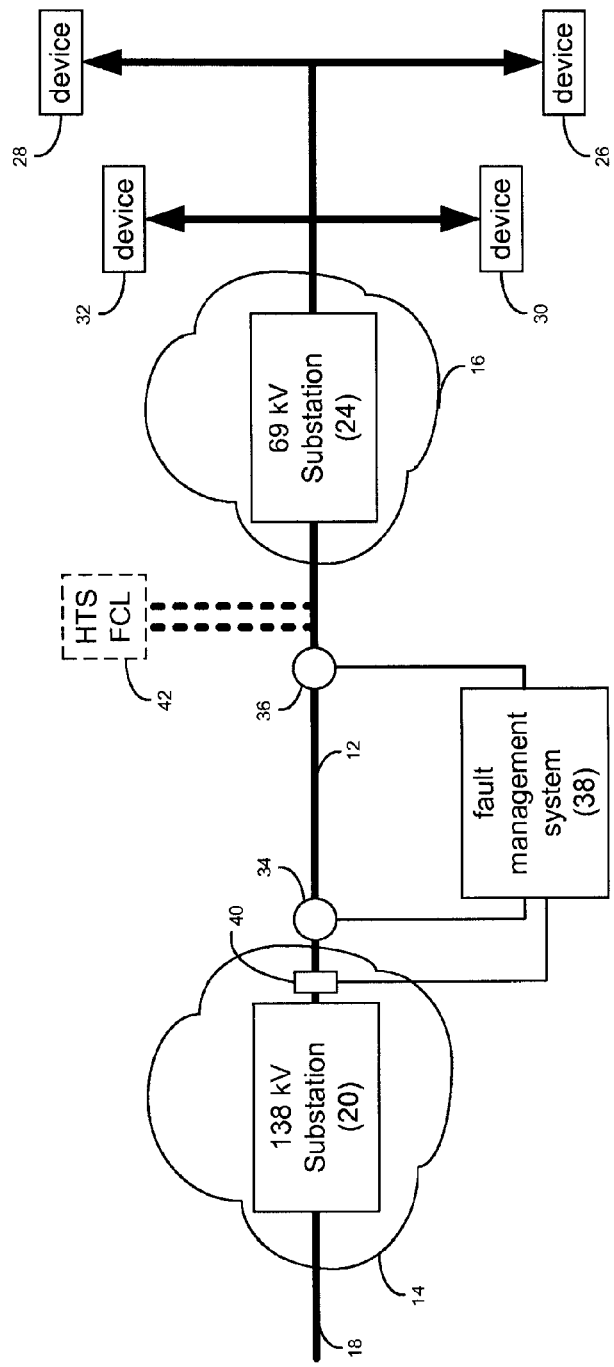
FIG. 1 is a schematic diagram of a copper-cored HTS cable system installed within a utility power grid.

Referring to FIG. 1, a portion of a utility power grid 10 may include a high temperature superconductor (HTS) cable 12. HTS cable 12 may be hundreds or thousands of meters in length and may provide a relatively high current/low resistance electrical path for the delivery of electrical power from generation stations (not shown) or imported from remote utilities (not shown).

The cross-sectional area of HTS cable 12 may only be a fraction of the cross-sectional area of a conventional copper core cable and may be capable of carrying the same amount of electrical current or more. As discussed above, within the same cross-sectional area, an HTS cable may provide three to five times the current-carrying capacity of a conventional AC cable; and up to ten times the current-carrying capacity of a conventional DC cable. As FITS technology matures, these ratios may increase.

As will be discussed below in greater detail, HTS cable 12 includes HTS wire, which may be capable of handling as much as one-hundred-fifty times the electrical current of similarly-sized copper wire or more. Accordingly, by using a relatively small quantity of HTS wire (as opposed to a large quantity of copper conductors stranded within the core of a traditional AC cable), an HTS power cable may be constructed that is capable of providing three to five times as much electrical power as an equivalently-sized traditional copper-conductor power cable.

HTS cable 12 may be connected within a transmission grid segment 14 that carries voltages at a level of e.g., 138 kV and extends from grid segment 14 to grid segment 16, which may receive this voltage and transform it to a lower level of e.g., 69 kV. For example, transmission grid segment 14 may receive power at 765 kV (via overhead line or cable 18) and may include a 138 kV substation 20. 138 kV substation 20 may include a 765 kV/138 kV transformer (not shown) for stepping down the 765 kV power received on cable 18 to 138 kV. This "stepped-down" 138 kV power may then be provided via e.g., HTS cable 12 to transmission grid segment 16. Transmission grid segment 16 may include 69 kV substation 24, which may include a 138 kV/69 kV transformer (not shown) for stepping down the 138 kV power received via HTS cable 12 to 69 kV power, which may be distributed to e.g., devices 26, 28, 30, 32. Examples of devices 26, 28, 30, 32 may include, but are not limited to 34.5 kV substations.

The voltage levels discussed above are for illustrative purposes only and are not intended to be a limitation of this disclosure. Accordingly, this disclosure is equally applicable to various voltage and current levels in both transmission and distribution systems. Likewise, this disclosure is equally applicable to non-utility applications such as industrial power distribution or vehicle power distribution (e.g. ships, trains, aircraft, and spacecraft).

One or more circuit breakers 34, 36 may be connected on e.g., each end of HTS cable 12 and may allow HTS cable 12 to be quickly disconnected from utility power grid 10. Fault management system 38 may provide over-current protection for HTS cable 12 to ensure that HTS cable 12 is maintained at a temperature that is below the point at which HTS cable 12 may be damaged.

Fault management system 38 may provide such over-current protection by monitoring the current flowing in the segment of the utility grid to which HTS cable 12 is coupled. For example, fault management system 38 may sense the current passing through 138 kV substation 20 (using e.g., current sensor 40) and may control the operation of breakers 34, 36 based, at least in part, on the signal provided by current sensor 40.

In this example, HTS cable 12 may be designed to withstand a fault current as high as 51 kA with a duration of 200 ms (i.e., 12 cycles of 60 Hz power). The details of fault management system 38 are described in U.S. patent application Ser. No. 11/459,167, issued Dec. 4, 2007 as U.S. Pat. No. 7,304,826 entitled Fault Management of HTS Power Cable. Typically, in order to withstand this level of fault current, the HTS cable may contain a significant amount of copper, which may help to carry the high fault current and thus protect the HTS wires. The copper is present to protect the HTS cable, but it has no significant current limiting effect because of its very low resistance.

Figure 2:
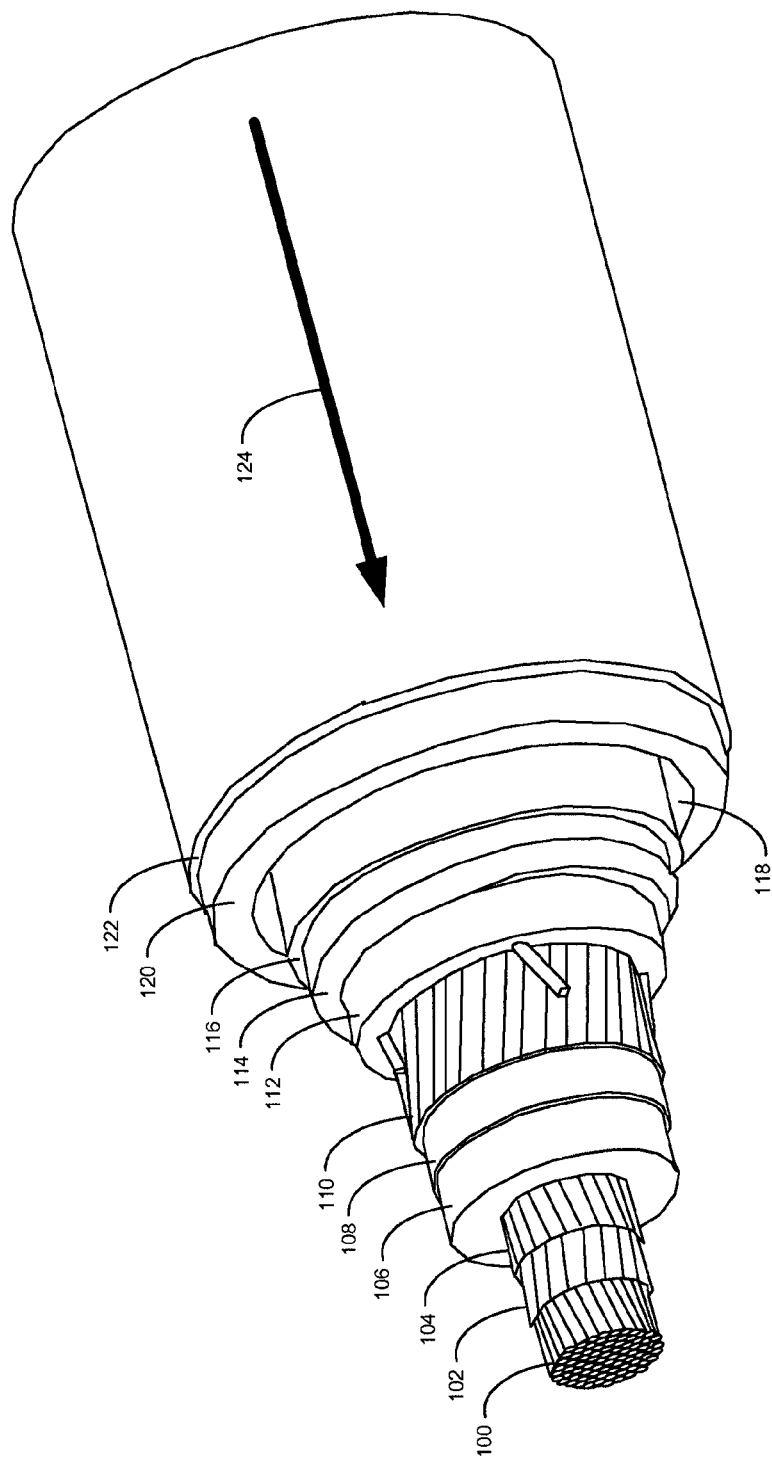
FIG. 2 is an isometric view of the copper-cored HTS cable of FIG. 1.

Referring also to FIG. 2, there is shown a typical embodiment of a single-phase copper-cored HTS cable 12 that may include stranded copper core 100 surrounded in radial succession by first HTS layer 102, second HTS layer 104, high voltage dielectric insulation layer 106, copper shield layer 108, HTS shield layer 110, coolant passage 112, inner cryostat wall 114, thermal insulation 116, vacuum space 118, outer cryostat wall 120 and an outer cable sheath 122. HTS layer 102 and HTS layer 104 may also be referred to as "phase conductors". Copper shield layer 108 may alternatively be positioned on the outside of HTS shield layer 110. During operation, a refrigerant or liquid cryogen (e.g., liquid nitrogen, not shown) may be supplied from an external coolant source (not shown) and may be circulated within and along the length of coolant passage 112. All components of the cable are designed so as to enable flexibility of HTS cable 12. For example, stranded copper core 100 (upon which first HTS layer 102 and second HTS layer 104 are wound) is flexible. Accordingly, by utilizing flexible stranded copper core 100, an HTS cable 12 is realized that is continuously flexible along its length. Optionally, a corrugated metal former may be used to support the helically wound HTS wires, providing continuous flexibility along the length of the cable.

Additionally/alternatively, additional coaxial HTS and insulation layers may be utilized. For example, more than two layers of HTS wires may be used for a single phase. Also, three groups of HTS layers separated by insulation layers (not shown) may be utilized to carry three-phase power. An example of such a cable arrangement is the Triax HTS Cable arrangement proposed by Ultera (i.e., a joint venture of Southwire Company of Carrollton, Ga. and nkt cables of Cologne, Germany). Other embodiments of HTS cable 12 may include, but are not limited to: warm and/or cold dielectric configurations; single-phase vs. multi-phase configurations; and various shielding configurations (e.g., no shield and cryostat-based shielding).

Copper core 100 and copper shield layer 108 may be configured to carry fault currents (e.g., fault current 124) that may appear within cable 12. For example, when fault current 124 appears within cable 12, the current within HTS layers 102, 104 may dramatically increase to a level that exceeds the critical current level (i.e., $I_c$) of HTS layers 102, 104, which may cause HTS layers 102, 104 to lose their superconducting characteristics (i.e., HTS layers 102, 104 may go "normal"). A typical value for critical current level $I_c$ is 4,242 $A_{peak}$ for a cable rated at 3000 $A_{rms}$ (where $A_{rms}$ refers to root-mean-square Amperes of current).

The critical current level in HTS materials may depend upon the choice of electric field level. Conventionally, the critical current level $I_c$ is defined as an electric field level of 1 microvolt/cm, though lower values are also used. However, typical superconductors exhibit a transition region between the zero-resistance (i.e., superconducting) and fully-resistive (i.e., non-superconducting) states as a function of current level. Conductor losses resulting from operation in this transition region are below those of the fully-resistive state. Therefore, in practice, portions of conductor in the HTS cable may switch to the fully resistive state at a critical current level that is a factor ("f") times the conventional critical current level $I_c$ defined by the 1 microvolt/cm criterion. In meander line wires with YBCO thin films, this factor was determined to be approximately 2, but it was observed to vary somewhat with time. See *Switching Behavior of YBCO Thin Film Conductors in Resistive Fault Current Limiters* by H.-P. Kraemer et al., IEEE Transactions on Applied Superconductivity, vol. 13, No. 2, June 2003, pp. 2044-7. The f-factor for HTS wires with similar YBCO thin films is anticipated to be in a similar range (e.g., 1-4).

Accordingly, when the product of the critical current level (as defined above) and the f-factor is exceeded, the resistance of HTS layers 102, 104 may increase significantly and may become comparatively high (i.e., when compared to copper core 100). As the current passing through a plurality of parallel conductors is distributed inversely with respect to the resistance of the individual conductors, the majority of fault current 124 may be diverted to copper core 100, which is connected in parallel with HTS layers 102, 104. This transmission of fault current 124 through copper core 100 may continue until: fault current 124 subsides; or the appropriate circuit breakers (e.g., circuit breakers 34, 36) interrupt the transmission of fault current 124 through HTS cable 12.

Overheating of the HTS conductors in HTS cable 12 may be avoided by two benefits provided by the copper core 100. First, by redirecting fault current 124 (or at least a portion thereof) from HTS layers 102, 104 to copper core 100, the overheating of the HTS conductors in HTS cable 12 may be avoided. And second the added heat capacity of copper core 100 reduces the temperature rise in HTS layers 102 and 104. In the event that fault current 124 (or at least a portion thereof) was not redirected from HTS layers 102, 104 to copper core 100, fault current 124 may heat the HTS conductors in HTS cable 12 significantly due to the high resistance of HTS layers 102, 104, which may result in the formation of gaseous "bubbles" of liquid nitrogen (i.e., due to liquid nitrogen being converted from a liquid state to a gaseous state within coolant passage 112). Unfortunately, the formation of gaseous "bubbles" of liquid nitrogen may reduce the dielectric strength of the dielectric layer and may result in voltage breakdown and the destruction of HTS cable 12. For warm dielectric cable configurations (not shown), fault current not redirected away from HTS layers 102, 104 may simply overheat and destroy HTS layers 102, 104.

Examples of HTS cable 12 may include but are not limited to HTS cables available from Nexans of Paris France; Sumitomo Electric Industries, Ltd., of Osaka, Japan; and Ultera (i.e., a joint venture of Southwire Company of Carrollton, Ga. and NKT cables of Cologne, Germany).

While copper core 100 redirects fault currents (or portions thereof) around HTS layers 102, 104, there are disadvantages to utilizing such an "internal" copper core. For example, copper core 100 may require HTS cable 12 to be physically larger and heavier, which may result in increased cost and greater heat retention within HTS cable 12. Accordingly, more refrigeration may be required to compensate for the additional heat retention, resulting in higher overall system and operating costs. Moreover, the increased heat capacity of copper core 100, and the thermal resistance between the HTS layers 102, 104, and the coolant due to the dielectric layer may greatly increase recovery times should the energy of a fault current increase the temperature beyond the point where superconductivity can be maintained in HTS layers 102, 104. For example, in the event that a fault current is redirected through copper core 100, it may take several hours for the refrigeration system (not shown) to cool down HTS cable 12 to within the appropriate operating temperature range (e.g., 65-77° Kelvin). The time required to cool down HTS cable 12 to within the operating range of the cable is commonly referred to as the "recovery time", which may be required by utilities to be as short as possible (e.g. seconds). Alternatively, a standalone fault current limiter may be used with HTS cable 12 to limit fault currents; however this has the disadvantage of requiring another large and costly piece of electrical equipment to be installed in the substation linked to HTS cable 12. As discussed above, the details of fault management system 38 are described in U.S. patent application Ser. No. 11/459,167, issued Dec. 4, 2007 as U.S. Pat. No. 7,304,826 entitled Fault Management of HTS Power Cable.

Figure 3:
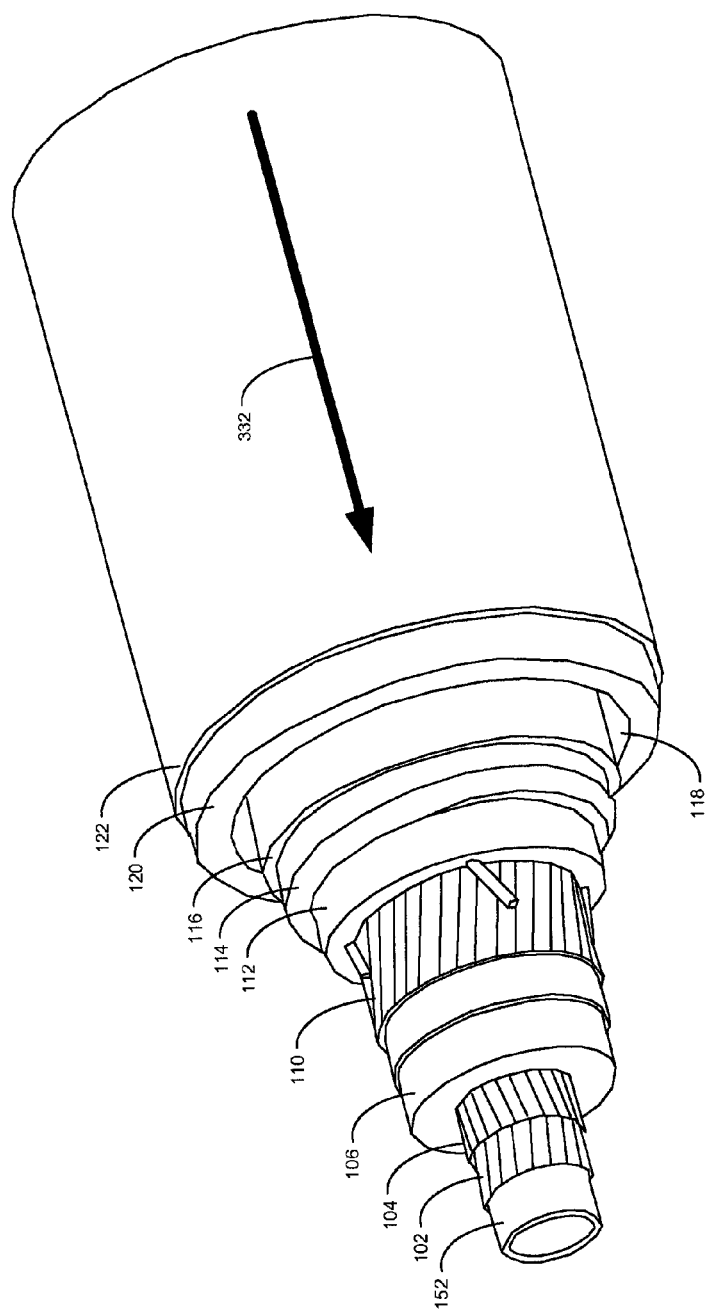
FIG. 3 is an isometric view of a hollow-core HTS cable.

Referring to FIG. 3, there is shown a flexible, hollow-core HTS cable 150, according to this disclosure. While HTS cable 150 may include various components of prior art copper-cored HTS cable 12, HTS cable 150 does not include stranded copper core 100 (FIG. 2), which was replaced with a flexible hollow core (e.g., inner coolant passage 152). An example of inner coolant passage 152 may include, but is not limited to, a flexible, corrugated stainless steel tube. All copper shield layers are removed as well. A refrigerant (e.g., liquid nitrogen) may flow through inner coolant passage 152.

In a fashion similar to that of copper-cored HTS cable 12, inner coolant passage 152 may be surrounded in radial succession by first HTS layer 102, second HTS layer 104 (usually helically wound with the opposite helicity of layer 102), high voltage dielectric insulation layer 106, HTS shield layer 110, coolant passage 112, inner cryostat wall 114, thermal insulation 116, vacuum space 118, outer cryostat wall 120 and an outer cable sheath 122. During operation, a refrigerant (e.g., liquid nitrogen, not shown) may be supplied from an external coolant source (not shown) and may be circulated within and along the length of coolant passage 112 and inner coolant passage 152. An alternative coolant (e.g., liquid neon or liquid hydrogen) may be used in the case of lower transition temperature materials like $MgB_2$.

As with HTS cable 12, all components of HTS cable 150 are designed so as to enable flexibility continuously along the length of the cable. For example and as discussed above, inner coolant passage 152 (upon which first HTS layer 102 and second HTS layer 104 are wound) is flexible. Accordingly, by utilizing flexible inner coolant passage 152, a flexible HTS cable 150 is realized.

Figure 4:
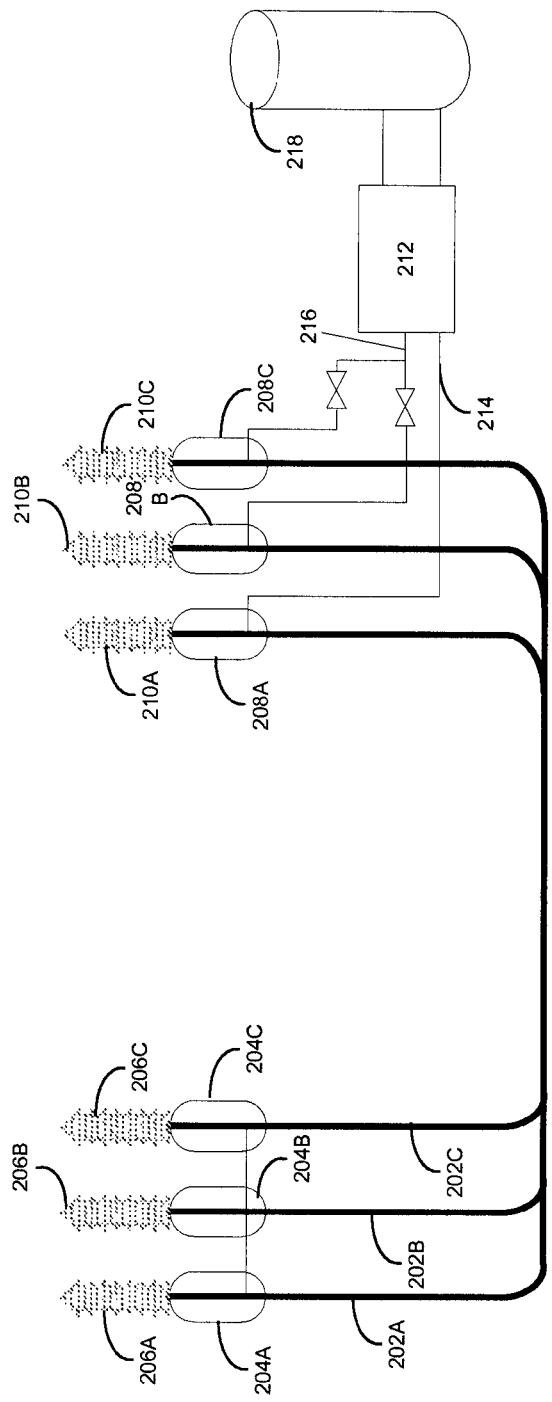
FIG. 4 is a schematic diagram a cooling system for HTS cable.

Referring now to FIG. 4, there is a shown a cooling system 200 for use with HTS cable. Cooling system 200 may include, for example, three separate HTS cables 202A, 202B, and 202C. Each HTS cable may include both a cold termination and a high voltage termination on each end of the cable. For example, HTS cable 202A may include cold termination 204A coupled with high voltage termination 206A on a first end of the cable, and cold termination 208A coupled with high voltage termination 210A on a second end of the cable. HTS cables 202B and 202C may include similar configurations, as depicted in FIG. 4.

Each of HTS cables 202A, 202B, and 202C may be connected with a cryogenic refrigeration module 212, which may be connected with each cable via supply line 214 and return line 216. Any number of lines may be employed. Cryogenic refrigeration module 212 may also be connected with cryogenic storage container 218, which may be configured to store large quantities of a cryogenic coolant, such as liquid nitrogen. Cryogenic refrigeration module 212 may include various control systems (e.g., Supervisory Control and Data Acquisition (SCADA)) that may be configured to control the distribution of liquid nitrogen from liquid nitrogen storage container 218 to each of HTS cables 202A, 202B, and 202C. This system may also be used to monitor the temperature and/or pressure of HTS cables 202A-C and each cryogenic refrigeration module as well as for numerous other cooling, heating, or pressurization functions.

Cryogenic refrigeration module 212 may include various commercially available cryogenic refrigeration systems. Such systems may include, but are not limited to, systems provided by Air Liquide of Paris, France and Praxair, Inc. of Danbury, Conn. Moreover, it should be noted that the cryogenic coolant used in the embodiments described herein is not limited to liquid nitrogen. Other suitable coolants may include, but are not limited to, natural gas, gaseous helium, hydrogen, liquified air, gas mixtures of oxygen and nitrogen in various percentages other than what occur in air, and neon.

In some embodiments, HTS cables 202A, 202B, and 202C may be single phase cables, such as those described above with reference to FIG. 2. However, other HTS cable designs may also be used. For example, and as described above, three groups of HTS layers separated by insulation layers may be utilized to carry three-phase power. An example of such a cable arrangement is the Triax HTS Cable arrangement described above. These cable arrangements may be employed as well.

Figure 5:
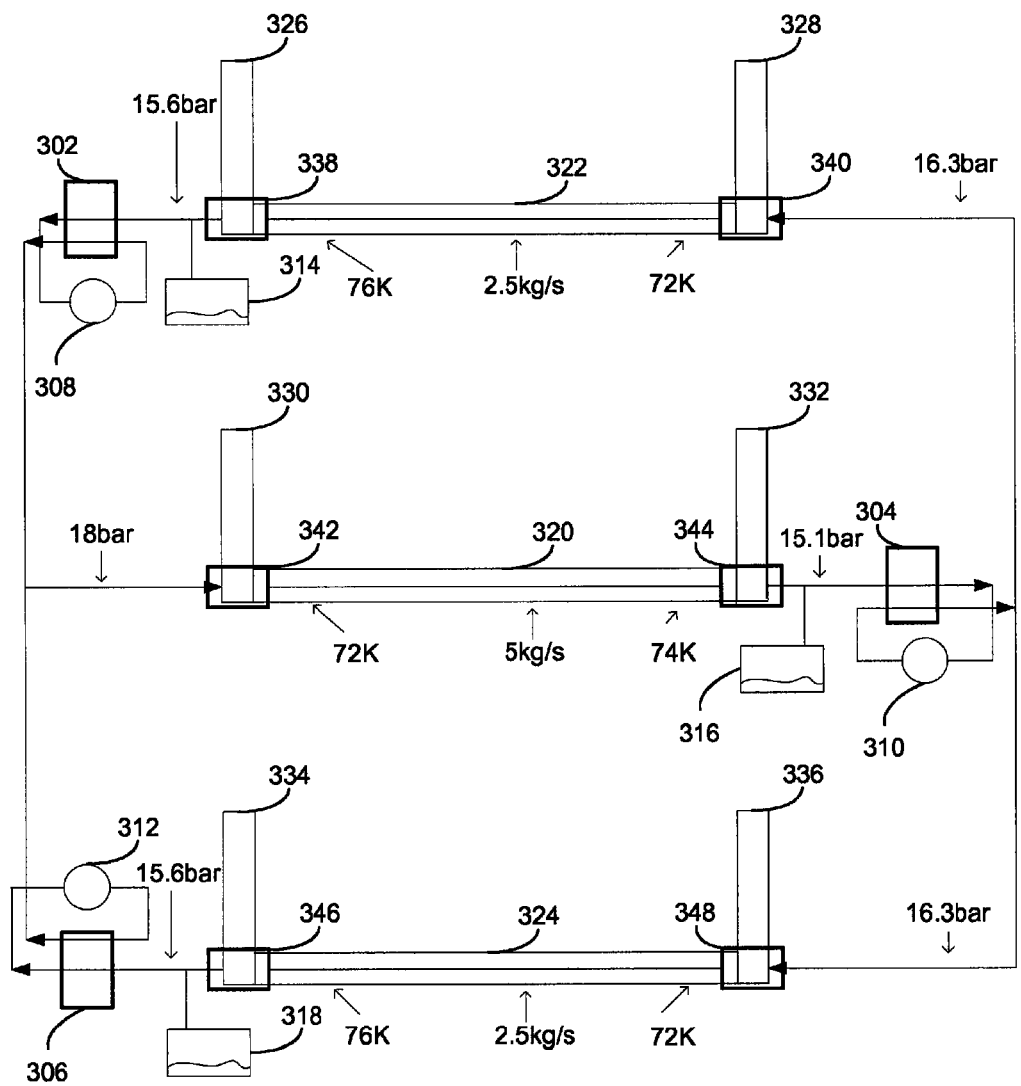
FIG. 5 is a schematic diagram of a cooling system for use with HTS cable.

Referring now to FIG. 5, an exemplary embodiment of a cooling system 300 for use with HTS cable is shown. Cooling system 300 may include a plurality of cryogenic refrigeration modules 302, 304 and 306. Cryogenic refrigeration modules 302, 304 and 306 may be similar in configuration to those described in FIG. 4 and/or any of the embodiments described herein. In some embodiments, the plurality of cryogenic refrigeration modules may be standardized modules, which may operate in accordance with different operating conditions.

Each of refrigeration modules 302, 304 and 306 may be operatively connected with an associated pump to assist in the transport of cryogenic coolant throughout system 300. For example, module 302 may be connected with pump 308, module 304 with pump 310, and module 306 with pump 312. Although FIG. 5 depicts three distinct cryogenic refrigeration modules any number of modules and/or pumps may be used without departing from the scope of the present disclosure.

In some embodiments, refrigeration modules 302, 304 and 306 may be configured to receive cryogenic coolant from various sections of HTS cable and/or at least one pressure control unit. These pressure control units are depicted in FIG. 5 as reference numerals 314, 316 and 318. Each of pressure control units 314, 316 and 318 may be configured to maintain a consistent operating pressure throughout system 300 and to receive and/or dispense cryogenic coolant in order to maintain a constant pressure as the temperature of the system changes. For example, each pressure control unit may be configured to receive an inflow of cryogenic coolant from a particular section of HTS cable in the event of a fault condition. That is, the corresponding increase in temperature that may occur as a result of a fault condition may have a corresponding effect upon the LN2 volume within a particular HTS cable. This increase in volume may cause the cryogenic coolant pressure to increase, and subsequently, to enter pressure control units 314, 316 and 318. Each pressure control unit may be constructed out of any suitable material, e.g., stainless steel, and may employ a vacuum insulated environment to reduce heat leak at normal operating conditions.

Each of pressure control units 314, 316 and 318 may be operatively connected with a termination associated with a section of HTS cable. For example, FIG. 5 depicts three distinct sections of HTS cable denoted by reference numerals 320, 322 and 324. Each section of HTS cable may include a first and second termination. For example, first section of HTS cable 320 may include first termination 330 and second termination 332, second section of HTS cable 322 may include first termination 326 and second termination 328 and third section of HTS cable 324 may include first termination 334 and second termination 336. Each termination may include a corresponding cryogenic coolant container depicted by reference numerals 338, 340, 342, 344, 346 and 348. Each cryogenic coolant container may be located adjacent at least a portion of its respective termination and may be configured to store cryogenic coolant such as liquid nitrogen. One example of a superconducting cable termination is described in *Cryogenic Refrigeration System for HTS Cables* by Ron C. Lee et al., IEEE Transactions on Applied Superconductivity, vol. 15, No. 2, June 2005, p. 1788. However, alternative termination designs may be employed as well.

In operation, cryogenic coolant of a particular temperature (e.g., 72K) and pressure (e.g., 18 bar) may be supplied to first HTS cable section 320 via refrigeration module 302 and refrigeration module 306. In this particular example, at the initial portion of HTS cable section 320 this coolant may have a temperature of approximately 72K, a pressure of approximately 18 bar and may be flowing at a rate of approximately 5 kg/s. Once the coolant approaches second termination 332 of first HTS cable 320 the coolant may have undergone a temperature increase, as indicated in FIG. 5 as 74K. The coolant may then leave first HTS cable section 320 and/or pressure control unit 316 at a second pressure (e.g., 15.1 bar). At this point, the coolant may then enter refrigeration module 304 where additional cooling and/or repressurization via pump 310 may occur. The original rate of coolant through first HTS cable section 320 (i.e., 5 kg/s) may then be approximately cut in half, here, resulting in two coolant streams of approximately 2.5 kg/s, each having an approximately equal pressure as they enter second section of HTS cable 322 and third section of HTS cable 324. Once in HTS cables 322 and 324 these two coolant streams may each have a temperature of approximately 72K, having undergone a temperature drop from module 304. As the coolant flows through each HTS cable there may be a corresponding temperature increase (e.g. from 72K to 76K) as the coolant travels along the length of the cable. Once the two coolant flows exit second and third HTS cables 322 and 324 they may enter refrigeration modules 302 and 306, respectively, for additional cooling and/or pressurization. These two coolant flows may then combine to form the supply for first HTS cable section 320.

This configuration provides a number of advantages over some prior implementations. For example, the utilization of multiple refrigeration modules allows for an increase in total HTS cable length. Moreover, this configuration may permit the use of standardized refrigeration modules, which may decrease costs associated with individually retrofitted designs. In some embodiments, a total cable length of approximately 5000 m may be achieved (e.g., using refrigeration modules having a 20 kW operating capability). However, as expected, an increase in operating power of the refrigeration module may permit a longer cable length. Of course, other configurations are also within the scope of the present disclosure.

Figure 6:
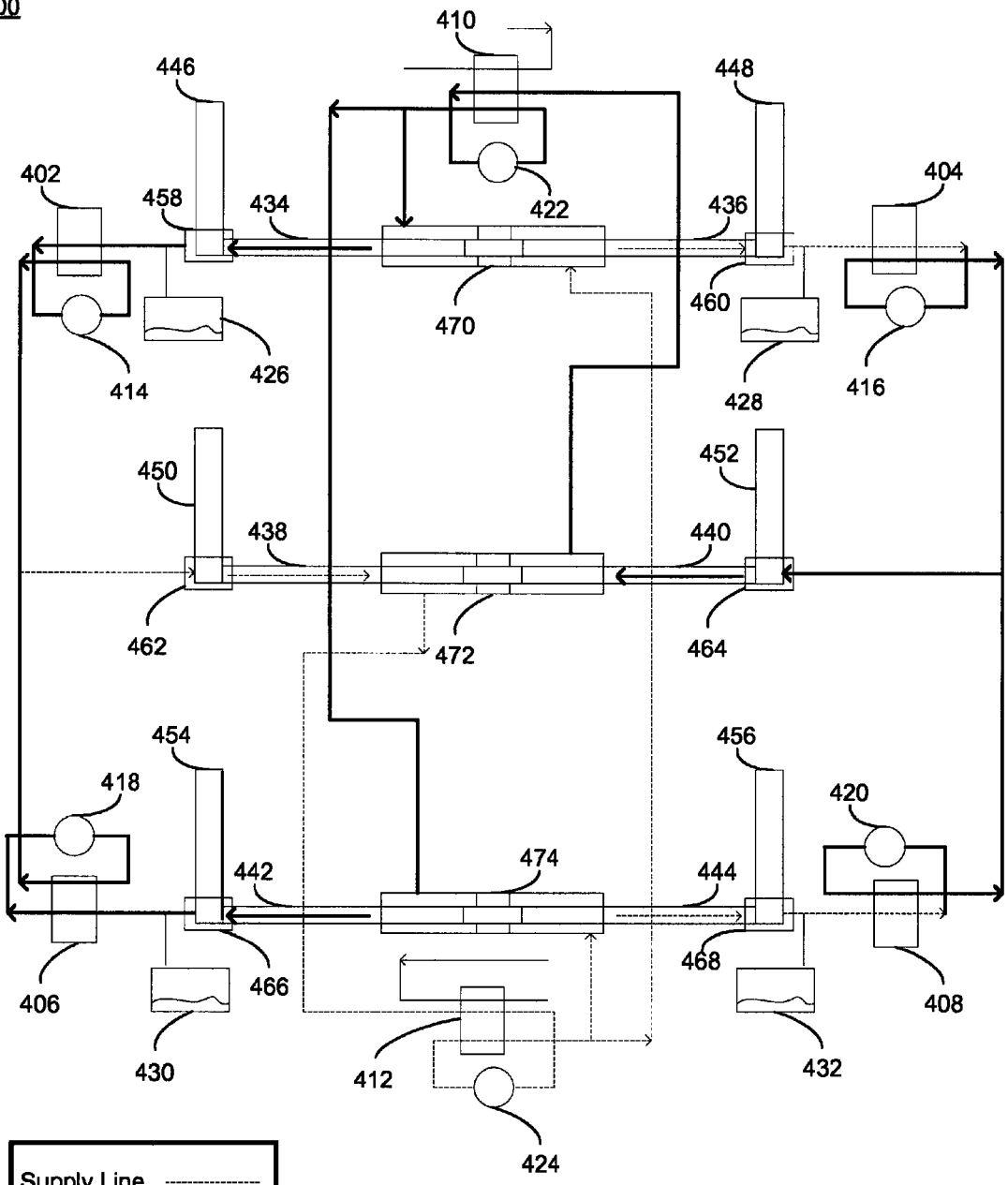
FIG. 6 is a schematic diagram of a cooling system for use with HTS cable including the cable joint of FIG. 7.

Referring now to FIG. 6, another exemplary embodiment of a cooling system 400 is shown. Cooling system 400 may include a number of refrigeration modules 402, 404, 406, 408, 410 and 412. Each refrigeration module may include at least one associated pump 414, 416, 418, 420, 422 and 424 and may be configured to supply cryogenic coolant to and/or to receive cryogenic coolant from HTS cable sections. System 400 may also include pressure control units 426, 428, 430 and 432, which may function in a manner similar to that described in FIG. 5 above. Each of refrigeration modules 402, 404, 406, 408, 410 and 412 may be in fluid communication with at least one section of HTS cable 434, 436, 438, 440, 442 and 444. For example, refrigeration module 402 may be in fluid communication with HTS cable section 434, refrigeration module 404 may be in fluid communication with HTS cable section 436, etc.

Each section of HTS cable may include a corresponding termination 446, 448, 450, 452, 454 and 456 on one end of the HTS cable section as well as a corresponding cryogenic coolant container 458, 460, 462, 464, 466 and 468. The coolant containers may be similar in configuration to those described herein. The opposing end, i.e., the end opposing the termination, of each section of HTS cable may be coupled with a cooling cable joint. In FIG. 6, three cooling cable joints are shown, as indicated by reference numerals 470, 472 and 474. Of course, additional cooling cable joints, sections of HTS cable, refrigeration modules, etc. may be added or removed from this figure depending upon the length of HTS cable desired. A more detailed discussion of the structure and operation of the cooling cable joints and one possible implementation is provided hereinbelow.

Figure 7:
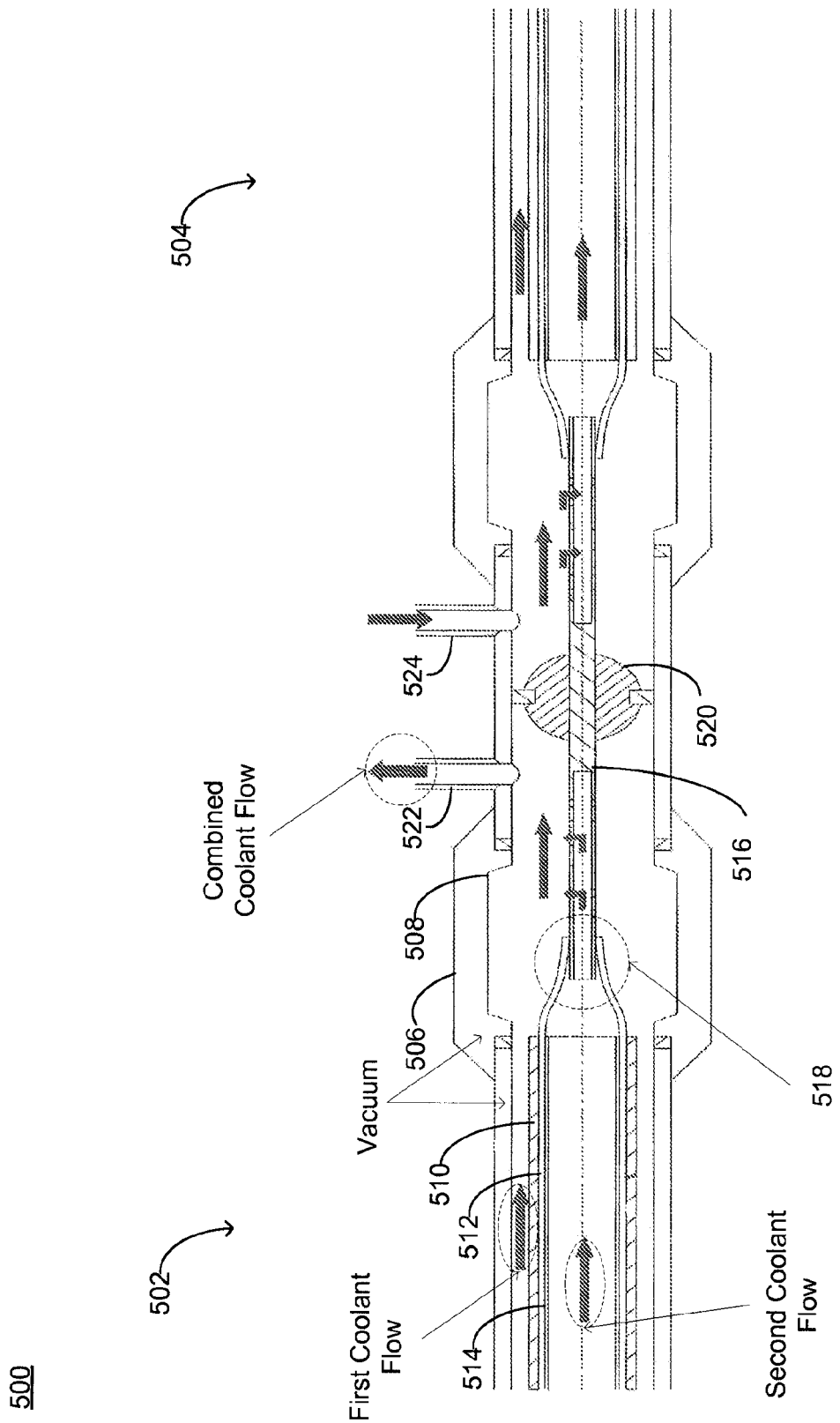
FIG. 7 is a cross-sectional view of a cable joint for use with a cooling system for use with HTS cable.
Figure 8:
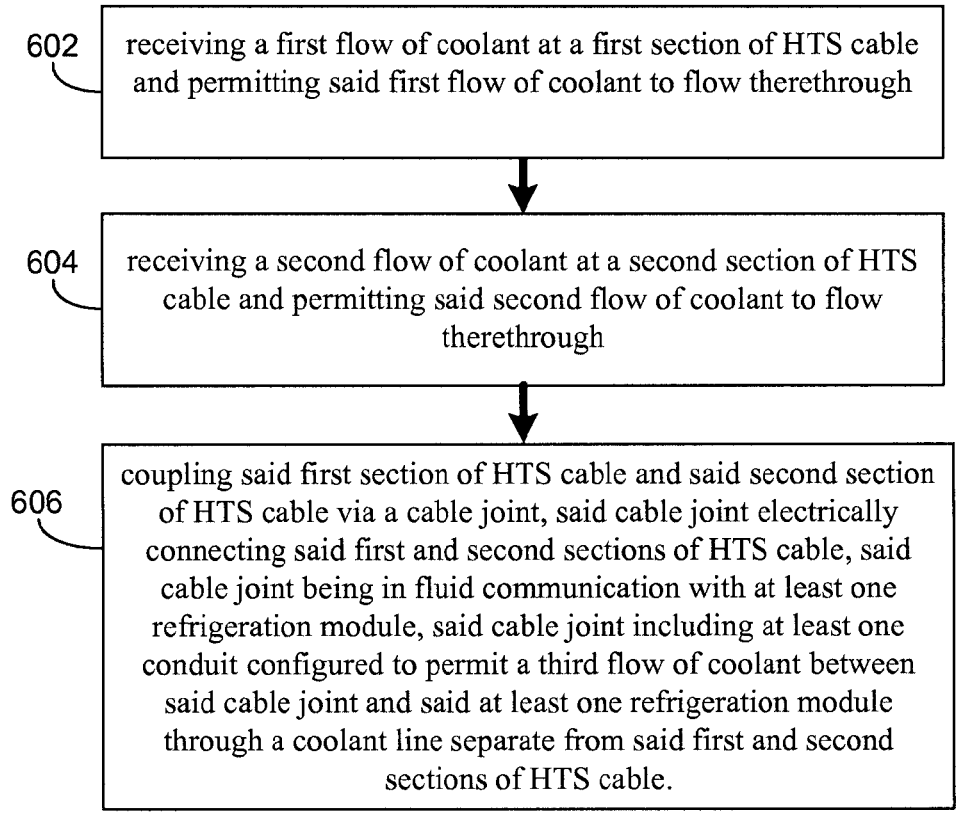
FIG. 8 is a flowchart of a method of cooling HTS cable.

Referring now to FIG. 7, an exemplary embodiment of a cooling cable joint 500 is shown. Cooling cable joint 500 may be configured to permit the re-cooling and re-pressurization of cryogenic coolant located within at least one section of HTS cable. In some embodiments, the use of one or more cooling cable joints 500 may allow for the construction and subsequent operation of long-length HTS cables.

In some embodiments, cooling cable joint 500 may be configured to connect a first section of HTS cable 502 with a second section of HTS cable 504. Cooling cable joint 500 may include, inter alia, an exterior layer 506 and an interior layer 508. Layers 506 and 508 may define a passageway configured to permit the flow of coolant therethrough. These layers may be constructed out of any number of suitable materials, for example, in at least one particular embodiment these layers may be constructed out of stainless steel. However, other materials, such as copper, are also within the scope of the present disclosure. Exterior layer 502 and interior layer 504 of cooling cable joint 500 may define a low pressure area or vacuum therebetween.

Each HTS cable, for example HTS cable 502, may include a plurality of layers similar, or equivalent to those described herein, for example those discussed with reference to FIGS. 2-3. As shown in FIG. 7, HTS cable 502 may include dielectric insulation layer 510, HTS wire layer 512, and former layer 514. In a corresponding arrangement, HTS cable 504 may include similar layers having an equivalent or similar configuration.

In some embodiments, HTS wire layer 512 may be in electrical connection with a conductive lead 516 at joint 518. In some embodiments, conductive lead 516 may be constructed out of copper, however, other materials are also envisioned. Conductive lead 516 may be configured to permit constant electrical connectivity between first section of HTS cable 502 and second section of HTS cable 504. Due to the resistive nature of conductive lead 516 (non-superconducting), a cooling method may be implemented to remove heat generation. As for example, section of the conductive lead 516 may be designed in such a way so that coolant is allowed to flow to remove the heat generation as shown in FIG. 7. Portions of cooling cable joint 500 may be connected with dielectric insulation section 520, which may be connected to ground and configured to withstand the HTS cable operating voltage between conductive lead 516 and ground potential. Conductive lead 516 may also include at least one opening configured to permit the flow of coolant therethrough as described in detail below.

In some embodiments, cooling cable joint 500 may be configured to receive cryogenic coolant from multiple portions of first section of HTS cable 502. For example, as cryogenic coolant is received from HTS cable, a first coolant flow may be created through interior layer 508 and conductive lead 516 of cooling cable joint 500. A second flow of coolant may flow between former layer 514 of HTS cable 502, to an interior portion of conductive lead 516, which is shown at joint 518. The interior portion of conductive lead 516 may include at least one opening configured to allow the combination of the first and second coolant flows. The combined coolant flow may travel through a coolant line separate from any of the HTS cable sections. This combined coolant flow may be sent to at least one refrigeration module for additional cooling and pressurization as necessary via first conduit 522. For example, any of cryogenic refrigeration modules 402, 404, 406, 408, 410 and 412. Once the cryogenic coolant has been properly re-cooled and/or repressurized, the re-cooled coolant may be transferred from the refrigeration module and received at second conduit 524 of cooling cable joint 500. At this point, the re-cooled and/or repressurized coolant may re-enter cooling cable joint 500 and this coolant may flow through second section of HTS cable 504 in a manner similar to that described in the description of first section of HTS cable 502.

Referring again to FIGS. 6 and 7, cooling system 400 may utilize cooling cable joints 470, 472 and 474 to increase the length of an HTS cable while maintaining substantially the same minimum pressure (e.g., 16 bar) and maximum phase conductor temperature (e.g., 76K) throughout the HTS cable's length. In operation, cryogenic coolant may be supplied by refrigeration modules 402 and 406 to HTS cable section 438. The cryogenic coolant may flow through HTS cable section 438 until it is received at first cable joint 472. As expected, the cryogenic coolant may undergo a temperature increase along the length of HTS cable section 438. The coolant may then enter first cable joint 472, which may have a configuration similar to that described in FIG. 7 above (602). The coolant may be delivered through first conduit 522 to refrigeration module 412, which may be configured to re-cool and/or re-pressurize the received coolant. The coolant may then be pumped to second cable joint 470 and third cable joint 474. The coolant may be received via second conduit 524 associated with each of second cable joint 470 and third cable joint 474. Once the coolant has been received at cable joints 470 and 474, it may flow within HTS cable sections 436 and 444 respectively until reaching refrigeration modules 404 and 408 for additional cooling and/or re-pressurization via pumps 416 and 420. In the event of a fault condition and as described above, pressure control units 426, 428, 430 and 432 may be utilized to maintain a constant pressure throughout each of the HTS cable sections.

Upon exiting each of refrigeration modules 404 and 408 the coolant may form a return line for distribution through cooling joint 472. The coolant flow from each of refrigeration modules 404 and 408 may be combined and may flow through HTS cable section 440 until reaching first cable joint 472 (604). As discussed above, cable joint 472 may electrically connect a portion of HTS wire associated with first HTS cable section 438 with a portion of HTS wire associated with second HTS cable section 440 (606). The return line may continue through refrigeration module 410 and pump 422, which may perform additional re-cooling and re-pressurization as needed. This coolant may then be sent to second and third cable joints 470 and 474, as indicated in FIG. 6. Cable joint 470 may receive the coolant from refrigeration module 410 and may permit the coolant to flow through HTS cable section 434 to refrigeration module 402. Similarly, cable joint 474 may also receive the coolant from refrigeration module 410 and permit the coolant to flow through HTS cable section 442 to refrigeration module 406. Once cooled at refrigeration modules 402 and 406 the two coolant streams may be combined to form the supply line for HTS cable section 438.

A number of implementations have been described. Nevertheless, it will be understood that various modifications may be made. Accordingly, other implementations are within the scope of the following claims.

What is claimed is:

1. A method for cooling high temperature superconducting cables, comprising:
   flowing a coolant through a first high temperature superconducting (HTS) cable, the first HTS cable comprising a first cable subsection and a second cable subsection and a first cable joint configured to couple the first and the second subsections thereof;
   flowing a coolant through a second high temperature superconducting (HTS) cable, the second HTS cable comprising a first cable subsection and a second cable subsection and a second cable joint configured to couple the first and the second subsections thereof;

flowing a coolant through a third high temperature superconducting (HTS) cable, the third HTS cable comprising a first cable subsection and a second cable subsection each and a third cable joint configured to couple the first and the second subsections thereof;

using a first refrigeration module in fluid communication with the first cable joint for receiving and cooling at least a portion of the coolant flowing through said first HTS cable and dividing said at least a portion of the coolant into a first coolant stream and a second coolant stream; returning the first coolant stream to said second cable joint via a first coolant line and returning the second coolant stream to said third cable joint via a second coolant line; wherein the first and second coolant lines are separate from said first, second, and third HTS cables;

using a second refrigeration module in fluid communication with one of the first or second subsections of the second HTS cable for receiving and cooling a portion of the coolant flowing through the second HTS cable and providing the cooled portion of the coolant to the first HTS cable; and using a third refrigeration module in fluid communication with one of the first or second subsections of the third HTS cable for receiving and cooling a portion of the coolant flowing through the third HTS cable and providing the cooled portion of the coolant to the first HTS cable.

2. The method of claim 1 further including using a fourth refrigeration module in fluid communication with the first cable joint for receiving and cooling at least a portion of the coolant flowing through said first HTS cable and dividing said at least a portion of the coolant into a third coolant stream and a fourth coolant stream and returning the third coolant stream to said second cable joint via a third coolant line and returning the fourth coolant stream to said third cable joint via a fourth coolant line; wherein the third and fourth coolant lines are separate from said first, second, and third HTS cables.

3. The method of claim 2 further including a fifth refrigeration module in fluid communication with one of the first or second subsections of the second HTS cable for receiving and cooling a portion of the coolant flowing through the second HTS cable and providing the cooled portion of the coolant to the first HTS cable.

4. The method of claim 3 further including a sixth refrigeration module in fluid communication with one of the first or second subsections of the second HTS cable for receiving and cooling a portion of the coolant flowing through the second HTS cable and providing the cooled portion of the coolant to first HTS cable.

* * * * *